United States Patent
Seidel et al.

(10) Patent No.: US 7,564,718 B2
(45) Date of Patent: Jul. 21, 2009

(54) METHOD FOR PROGRAMMING A BLOCK OF MEMORY CELLS, NON-VOLATILE MEMORY DEVICE AND MEMORY CARD DEVICE

(75) Inventors: Konrad Seidel, Dresden (DE); Uwe Augustin, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 225 days.

(21) Appl. No.: 11/402,649

(22) Filed: Apr. 12, 2006

(65) Prior Publication Data
US 2007/0242518 A1    Oct. 18, 2007

(51) Int. Cl.
*G11C 16/04*    (2006.01)
*G11C 16/06*    (2006.01)

(52) U.S. Cl. .................... 365/185.28; 365/185.22; 365/185.33

(58) Field of Classification Search ............. 365/185.28
See application file for complete search history.

(56) References Cited

U.S. PATENT DOCUMENTS

| | | | |
|---|---|---|---|
| 5,430,674 A | | 7/1995 | Javanifard |
| 5,495,442 A | * | 2/1996 | Cernea et al. .......... 365/185.03 |
| 6,011,725 A | | 1/2000 | Eitan |
| 6,069,822 A | * | 5/2000 | Canegallo et al. ...... 365/185.22 |
| 6,477,087 B2 | | 11/2002 | Tanaka et al. |
| 6,816,411 B2 | | 11/2004 | Arai et al. |
| 6,882,567 B1 | * | 4/2005 | Wong .................... 365/185.03 |
| 7,224,614 B1 | * | 5/2007 | Chan .................... 365/185.22 |
| 7,239,557 B2 | * | 7/2007 | Ha ........................ 365/185.33 |

* cited by examiner

*Primary Examiner*—Son L Mai
(74) *Attorney, Agent, or Firm*—Slater & Matsil, L.L.P.

(57) ABSTRACT

A method is provided for programming a block of memory cells of a non-volatile memory device. A first group of memory cells of the block of memory cells is selected. At least one programming pulse is programmed into all memory cells of the first group. A threshold level is detected for each one of the memory cells of the first group only. The first group of memory cells is verified by comparing each one of the detected threshold levels with predefined target levels provided for each one of the first group of memory cells.

11 Claims, 12 Drawing Sheets

FIG 4A

| Target value | 0 | 1 | 1 | 0 |
|---|---|---|---|---|
| First program | PGM | - | - | PGM |
| First verify | 1 X | - √ | - √ | 0 √ |
| Second program | PGM | - | - | (PGM) |
| Second verify | 0 √ | - √ | - √ | 0 √ |

FIG 4B

| Target value | 0 | 1 | 1 | 0 |
|---|---|---|---|---|
| First verify | 1 X | 1 √ | 1 √ | 0 √ |
| Second program | PGM | - | - | - |
| Second verify | 0 √ | - √ | - √ | - √ |

FIG 4C

| Target value | 0 | 1 | 1 | 0 |
|---|---|---|---|---|
| First program | PGM | - | - | PGM |
| First verify | 1 X | - √ | - √ | 0 √ |
| Second program | PGM | - | - | - |
| Second verify | 0 √ | - √ | - √ | - √ |

FIG 4D

| Target value | 0 | 1 | 1 | 0 |
|---|---|---|---|---|
| First verify | a) 1 X | b) → √ | c) → √ | |
| | | | | d) 0 √ |
| Second program | PGM | - | - | - |
| Second verify | a) 0 √ | b) → √ | c) → √ | d) → √ |

Note: First program row for FIG 4D: PGM | - | - | PGM

FIG 5A

| Target value | 0 | 1 | 1 | 0 | 0 | 1 | 1 | 0 |
|---|---|---|---|---|---|---|---|---|
| First program | P | - | - | P | P | - | - | P |
| First verify | a) 0 √ | b) → √ | c) → √ | | a) 1 X | b) → √ | c) → √ | |
|  |  |  |  | d) 0 √ |  |  |  | d) 0 X |
| Second program | - | - | - | - | P | - | - | P |
| Second verify | a) → √ | b) → √ | c) → √ | d) → √ | e) 0 √ | a) → √ | b) → √ | c) 0 √ |

FIG 11

| Pulse# | DQ Active | DQ Inactive | DQ Current Consum. | Gain |
|---|---|---|---|---|
| 1 | 256 | 0 | 25 mA | 0 mA |
| 2 | 180 | 76 | 18 mA | 7 mA |
| 3 | 33 | 223 | 3.3 mA | 21.7 mA |
| 4 | 2 | 264 | 0.2 mA | 24.8 mA |

FIG 5B

| Target value | 0,0 ± 0,1 (00) | 1,0 ± 0,1 (10) | 1,5 ± 0,1 (11) | 0,5 ± 0,1 (01) |
|---|---|---|---|---|
| 1. program | - | PGM | PGM | PGM |
| 1. verify | √ | 0,2 X | 0,3 X | 0,2 X |
| 2. program | - | PGM | PGM | PGM |
| 2. verify | √ | 0,5 X | 0,6 X | 0,4 √ |
| 3. program | - | PGM | PGM | - |
| 3. verify | √ | 0,8 X | 0,9 X | √ |
| 4. program | - | PGM | PGM | - |
| 4. verify | √ | 1,1 √ | 1,2 X | √ |
| 5. program | - | - | PGM | - |
| 5. verify | √ | √ | 1,5 √ | √ |

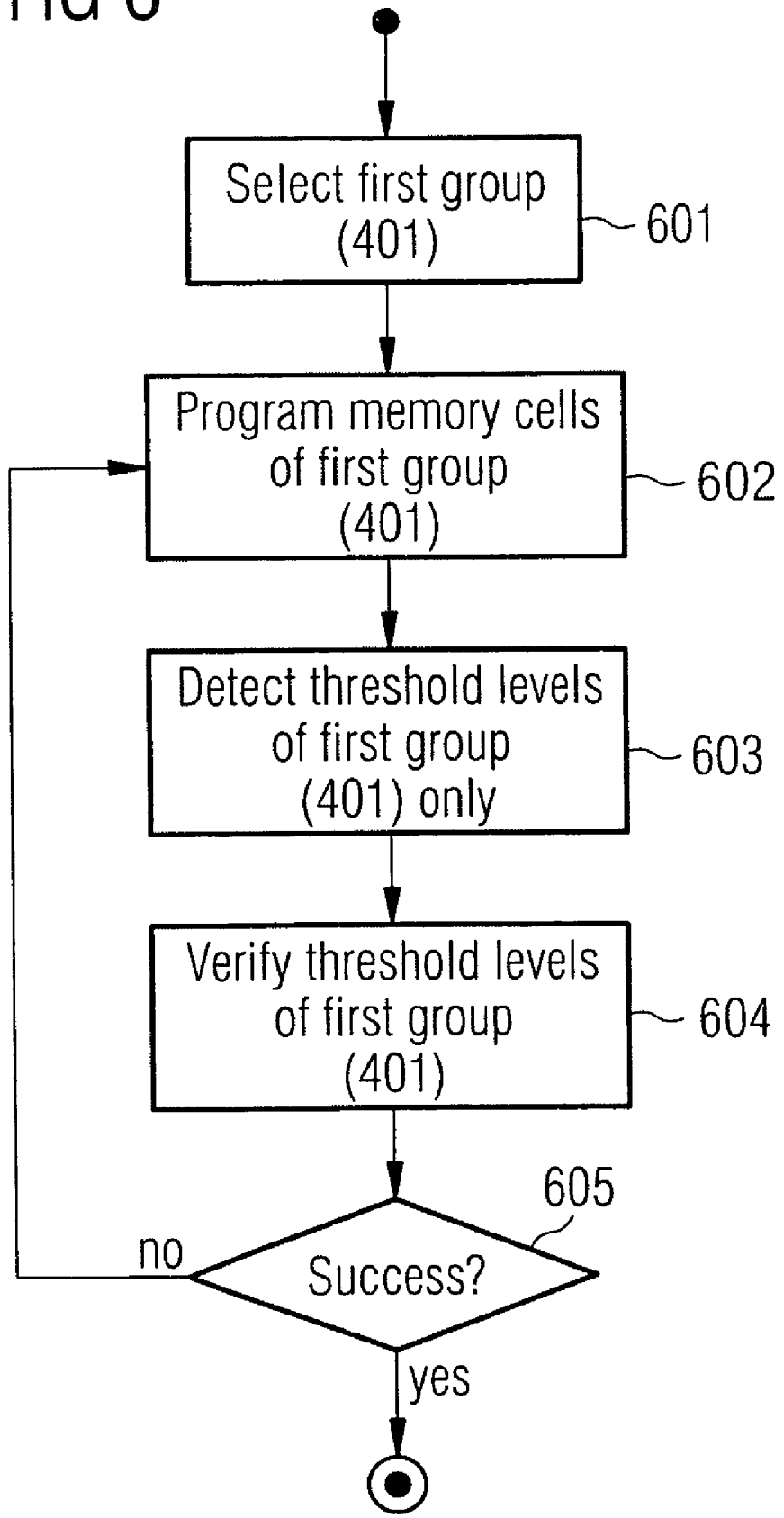

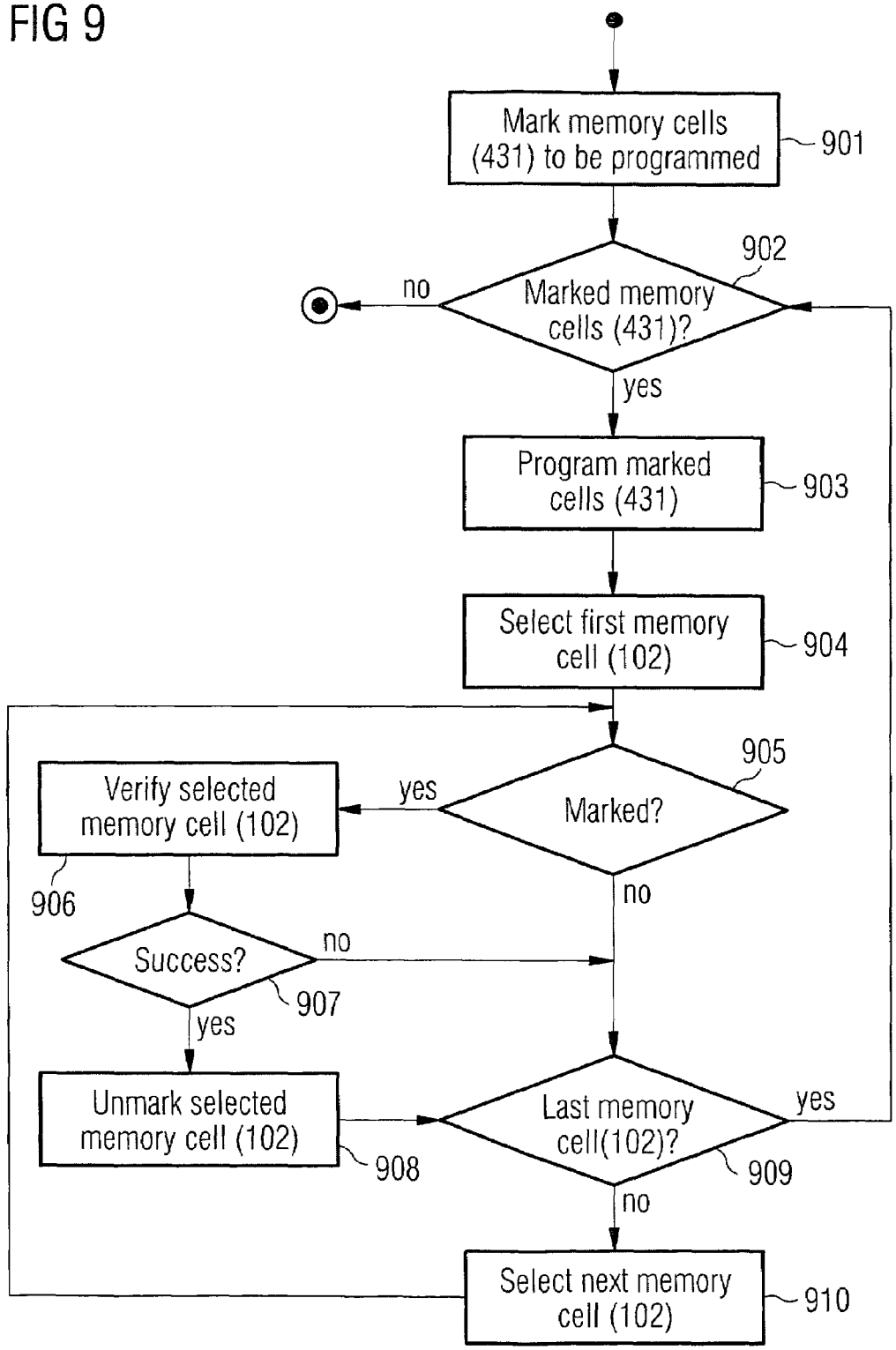

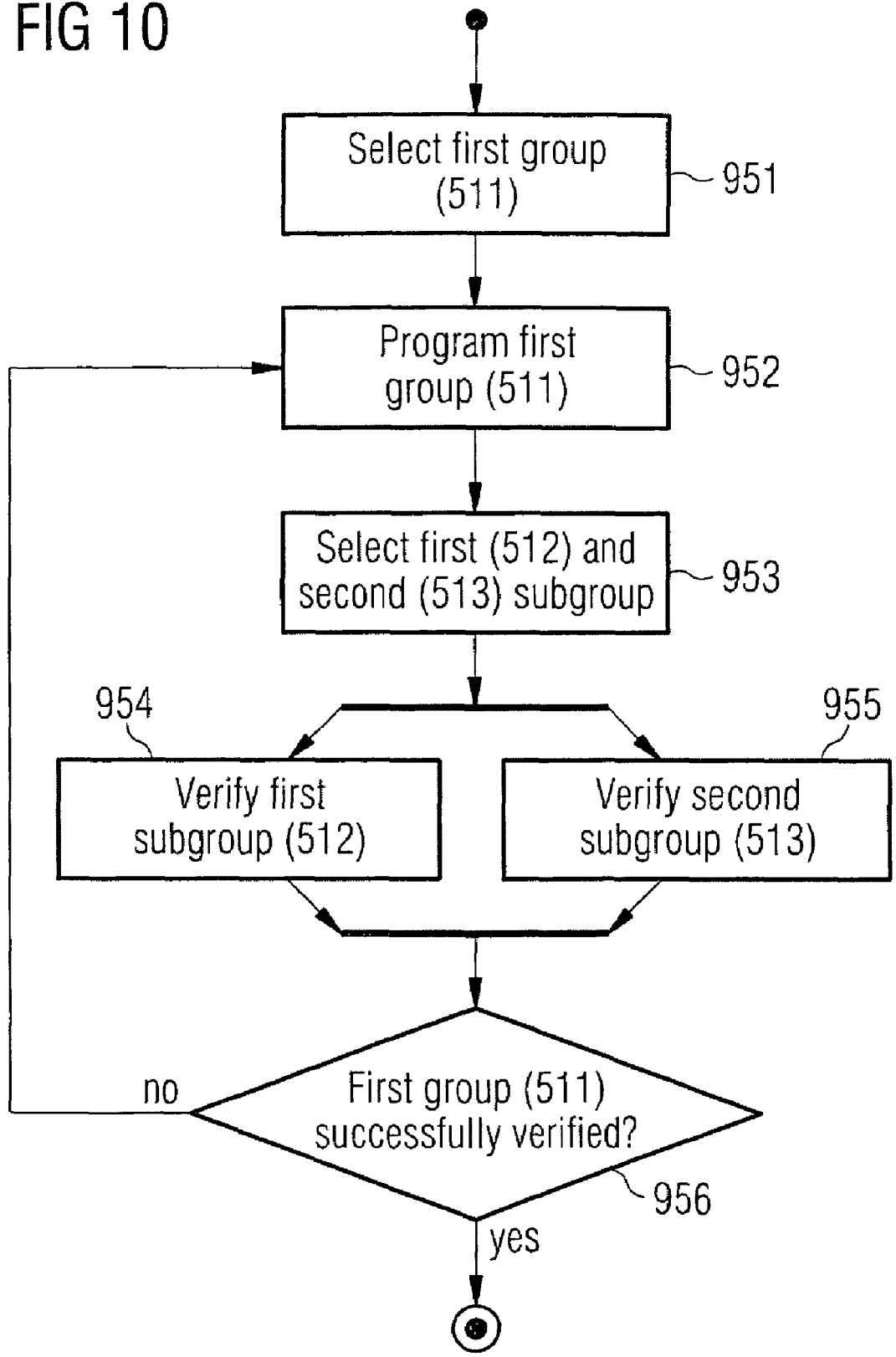

US 7,564,718 B2

METHOD FOR PROGRAMMING A BLOCK OF MEMORY CELLS, NON-VOLATILE MEMORY DEVICE AND MEMORY CARD DEVICE

TECHNICAL FIELD

The invention relates to a method for programming a block of memory cells of a non-volatile memory device. The invention further relates to a non-volatile memory device and a memory card device that are adapted to perform such a method.

BACKGROUND

Non-volatile memory devices are used in a variety of devices and applications. Unlike volatile memory devices, they maintain data stored therein even when they are disconnected from a power supply. Consequently, they are particularly useful in mobile devices.

There are different types of non-volatile memory devices. Whereas the memory content of read-only memory (ROM) and programmable ROM (PROM) devices cannot be altered, erasable PROM (EPROM), electronic erasable PROM (EEPROM) and flash EEPROM memory devices allow to reprogram some or all of the memory cells comprised therein.

EEPROM and flash EEPROM memory devices comprise a memory array comprising a multiplicity of transistors with charge-storage elements, the amount of charge stored in the charge-storage element affects a threshold level of the memory cell. Thus, the amount of charge stored in the charge-storage element is used to encode the logic programming state of the memory cell.

Such non-volatile memory devices further comprise a controller that is adapted to provide at least the following functions:

delete: serves to erase the content of one or a block of memory cells, program: serves to program a predefined data value into one or a block of memory cells, read: serves to read the content of one or a block of memory cells.

During delete and program operations, the threshold level of the affected memory cells is verified, often repeatedly, in order to make sure the memory cells are not over-programmed or over-erased. Over-programming and over-erasing in this context means that the threshold of a memory cell is pushed above or below a critical level, such that subsequent operations on the memory cell may fail. Excessive over-programming or over-erasing may also reduce the total lifetime of the memory device.

During verification the actual threshold level of the memory cell is compared with a designated target range or level. Memory cells out of this target range are then subjected to further programming or erase operations. Subsequently, the memory cells are verified again as described above until all memory cells are programmed or erased successfully.

Methods for verification of program and erase operations in non-volatile memory devices are known from the documents U.S. Pat. No. 6,477,087 and U.S. Pat. No. 6,816,411, which are both incorporated herein by reference.

Whereas in conventional EEPROM memory devices only a few programming and verification operations are required for successful programming, more advanced non-volatile memory devices, comprising, for example, multilevel cells (MLC) or nitride ROM (NROM) cells, often require more program and verification cycles. This is because the target levels in these cells are specified within narrower bounds.

In addition, the verification of NROM cells requires a relatively large current, which can be critical, particularly in mobile applications. This is due to the fact that bitlines, which need to be charged during verification, are longer in NROM cells than in other types of EEPROM memory devices, thus resulting in higher bitline capacities.

Consequently, there exists a need for improved methods and devices for programming and verifying memory cells.

SUMMARY OF THE INVENTION

According to a first aspect of the invention, a method for programming a block of memory cells for a non-volatile memory device is provided. The method comprises the steps of selecting a first group of memory cells of the block of memory cells, programming at least one programming pulse to all memory cells of the first group, detecting a threshold level for each one of the memory cells of the first group only and verifying the first group of memory cells by comparing each one of the detected threshold levels with predefined target levels provided for each one of the first group of memory cells.

By only detecting a threshold level for each one of the memory cells of a first group selected and programmed beforehand, verification of memory cells of a block of memory cells is restricted to the selected first group of memory cells. Restricting the verification helps to improve the performance of the verification and reduces the current consumption during detection.

According to an advantageous embodiment of the first aspect, the step of selecting the first of memory cells comprises selecting all memory cells that are to be programmed to a first logic value as the first group of memory cells.

By only selecting memory cells that are to be programmed to a first logic value, for example a low logic value, memory cells that are to be programmed to different logic values are not verified.

According to another advantageous embodiment of the first aspect, the step of selecting the first group of memory cells comprises detecting a first threshold level for each one of the memory cells of the block of memory cells, verifying the block of memory cells by comparing each one of the first detected threshold levels with predefined target levels provided for each one of the memory cells of the block of memory cells and selecting all memory cells that are verified unsuccessfully as the first group of memory cells.

After initially detecting and verifying threshold levels for all memory cells of the block of memory cells, only those memory cells that are verified unsuccessfully in the initial verification need to be selected for further programming and verification.

According to a further advantageous embodiment of the first aspect, the steps of programming, detecting and verifying are performed repeatedly, until all memory cells of the first group of memory cells have been verified successfully.

By performing the steps of programming, detecting and verifying repeatedly, memory cells of the first group of memory cells can be programmed and verified incrementally to a predefined threshold level.

According to a further advantageous embodiment of the first aspect, memory cells that have been verified successfully are removed from the first group in the step of verifying the first group of memory cells.

By removing successfully verified memory cells from the first group, the first group of memory cells that are still to be programmed and verified decreases successively.

According to a further advantageous embodiment of the first aspect, at least some of the memory cells of the first group of memory cells are verified sequentially.

By verifying memory cells sequentially the number of required sense amplifiers can be reduced. For example, a single sense amplifier can be used for detecting threshold levels of a multiplicity of memory cells.

According to a further advantageous embodiment of the first aspect, at least some of the memory cells of the first group of memory cells are verified in parallel.

By verifying at least some of the memory cells of the first group in parallel, the verification operation can be performed more rapidly.

According to a second aspect of the present invention, a non-volatile memory device is provided. The non-volatile memory device comprises an array of memory cells, each memory cell comprising a transistor with a charge storage element, an amount of charge stored in this charge storage element affecting a threshold level of the memory cell. The non-volatile memory device further comprises at least one column decoder adapted to select a column of the array of memory cells comprising a block of memory cells by means of a corresponding wordline, at least one write circuit adapted to selectively program at least one programming pulse to selected memory cells of the block of memory cells by means of corresponding bitlines, at least one sense amplifier adapted to detect a threshold level of a memory cell of the block of memory cells connectable to the sense amplifier by means of a corresponding bitline, a comparator adapted to compare a detected threshold level with a target threshold level and at least one control circuit adapted to prevent an unnecessary detection of a threshold level of a memory cell of the block of memory cells.

By providing a non-volatile memory device with a control circuit that prevents an unnecessary detection of the threshold level of a memory cell of a block of memory cells a method in accordance with a first aspect of the invention can be performed, such that the verification performance of the non-volatile memory device is improved.

According to an advantageous embodiment of the second aspect, the at least one sense amplifier is selectively connectable to a multiplicity of bitlines for detecting the threshold level of corresponding memory cells of the block of memory cells, the threshold level of the memory cells corresponding to the multiplicity of bitlines are detected sequentially and a control circuit is adapted to skip the detection of thresholds of memory cells in order to prevent the unnecessary detection of threshold levels.

By skipping the detection of thresholds of memory cells that do not need to be verified, a sequential verification of memory cells of the block of memory cells can be accelerated.

According to an advantageous embodiment of the second aspect, the memory device comprises at least two sense amplifiers and the at least two sense amplifiers are adapted to operate independently from each other.

By independently operating at least two sense amplifiers the verification operation of the non-volatile memory device can be accelerated as each sense amplifier can operate at the highest speed possible.

Further details and embodiments of the invention are described in the patent claims.

The invention will be described in more detail using the following figures disclosing presently preferred but nonetheless illustrative embodiments of the invention.

BRIEF DESCRIPTION OF THE DRAWINGS

For a more complete understanding of the present invention, and the advantages thereof, reference is now made to the following descriptions taken in conjunction with the accompanying drawing, in which:

FIG. 4A shows a first exemplary scenario for verification according to a first embodiment of the present invention;

FIG. 4B shows a second exemplary scenario for verification according to a second embodiment of the present invention;

FIG. 4C shows a third exemplary scenario for verification according to a third embodiment of the present invention;

FIG. 4D shows a fourth exemplary scenario for verification according to a fourth embodiment of the present invention;

FIG. 5A shows a fifth exemplary scenario for verification according to a fifth embodiment of the present invention;

FIG. 5B shows a sixth exemplary scenario for verification according to a sixth embodiment of the present invention;

FIG. 6 shows a flowchart of a method for verifying a block of memory in accordance with the first embodiment;

FIG. 9 shows a flowchart of a method for verifying a block of memory cells in accordance with the fourth embodiment;

FIG. 10 shows a flowchart of a method for verifying a block of memory cells in accordance with the fifth embodiment; and FIG. 11 shows a possible gain in power consumption for a memory device according to an embodiment of the invention.

The following list of reference symbols can be used in conjunction with the figures:

| | |
|---|---|
| 100 | non-volatile memory device |
| 101 | array |
| 102 | memory cell |
| 103 | column decoder |
| 104 | wordline |
| 105 | address bus |
| 106 | bitline |
| 107 | multiplexer |
| 108 | sense amplifier |
| 109 | write circuit |
| 110 | data latch |
| 111 | data bus |
| 112 | control circuit |
| 113 | control bus |
| 114 | comparator |
| 115 | block |
| 201 | floating gate transistor |
| 202 | control gate terminal |
| 203 | source terminal |
| 204 | drain terminal |
| 205 | floating gate |
| 300 | circuit arrangement |

-continued

| | |
|---|---|
| 301 | nitride layer |
| 302 | direction selection circuit |
| 303 | MOSFET transistor |
| 304 | bitline driver |
| 305 | high voltage source |
| 306 | reference source |
| 307 | target latch |
| 308 | control line |
| 401 | first group of memory cells (first scenario) |
| 411 | first group of memory cells (second scenario) |
| 421 | first group of memory cells (third scenario) |
| 431 | first group of memory cells (fourth scenario) |
| 511 | first group of memory cells (fifth scenario) |
| 512 | first subgroup |
| 513 | second subgroup |
| 601 to 605 | steps of the first method |
| 701 to 706 | steps of the second method |
| 801 to 806 | steps of the third method |
| 901 to 910 | steps of the fourth method |
| 951 to 956 | steps of the fifth method |
| $V_{Ref}$ | reference voltage |
| $C_S, C_D$ | bitline capacity |
| $s_F, s_B$ | control signal |

DETAILED DESCRIPTION OF ILLUSTRATIVE EMBODIMENTS

Figure 1:
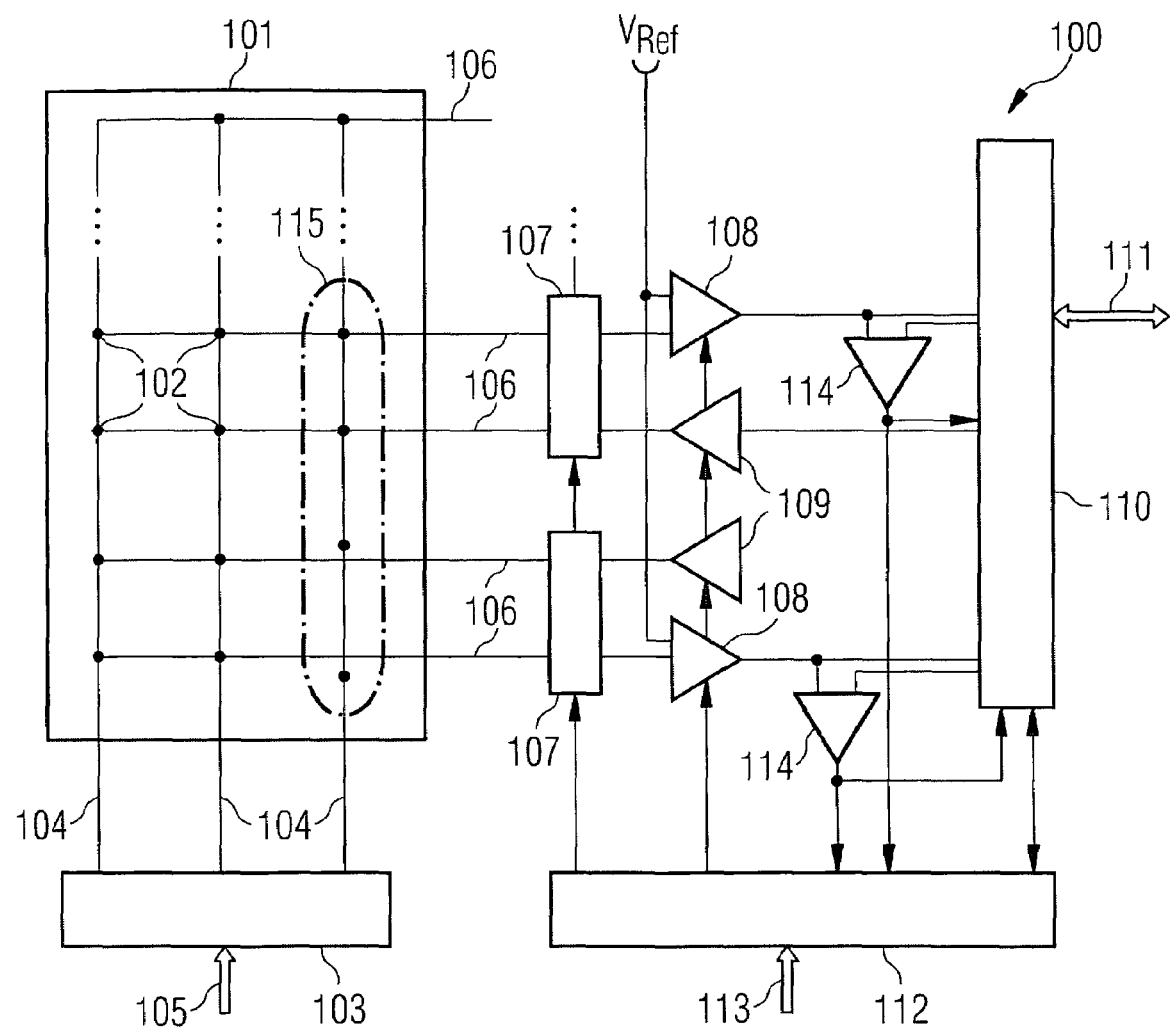
FIG. 1 shows a block diagram of a non-volatile memory device with a control circuit in accordance with an embodiment of the invention.

FIG. 1 shows a non-volatile memory device 100. The memory device 100 may be, for example, a memory card device used as a changeable storage medium in a computer, or an integrated circuit memory device integrated into a electronic device, for example a firmware module.

The memory device 100 comprises an array 101 of memory cells 102. Each memory cell 102 comprises a transistor with a charge storage element that is used to store a programming state of the memory cell 102.

For example, the memory cell 102 may be a floating gate MOSFET transistor in which an isolated conductive layer is situated between a control gate and a source drain channel of the transistor. By injecting electrons onto the floating gate the threshold level of the control gate required to enable a current between a source and a drain terminal of the transistor can be influenced, such that the amount of charge stored on the floating gate may be used to store a programming state of the memory cell 102. Alternatively, an NROM cell may be used as memory cell 102 in which charge carriers are trapped in a dielectric layer between a control gate and a source drain channel.

A column decoder 103 is used to select one of three depicted wordlines 104. The wordlines 104 are typically connected to the control gate of the transistors forming the memory cells 102. In FIG. 1, only three wordlines 104 are shown. However, in practice, many more wordlines 104 may be present in a memory device 100. For example, a memory device 100 may comprise, 512 or 1,024 wordlines 104. The column decoder 103 is further connected to an address bus 105 for receiving addresses that are to be selected by activating corresponding wordlines 104.

The array 101 is further connected by a number of bitlines 106. In practice, a large number of bitlines may be present. In the presented example, four bitlines 106 are used to connect a block 115 of four memory cells 102 of the array 101. Two bitlines 106 are connected to a first multiplexer 107 and two other bitlines 106 are connected to a second multiplexer 107. The multiplexers 107 serve to selectively connect one of the bitlines 106 to a corresponding sense amplifier 108 or write circuit 109. In the example shown in FIG. 1, each multiplexer 107 is connected to an associated sense amplifier 108 and an associated write circuit 109.

The write circuits 109 are used to selectively program memory cells 102 of the array 101. For example, electrons may be accelerated in the source/drain channel of a memory cell 102 by providing a first low voltage potential to a source terminal of the memory cell 102 and providing a second voltage potential, for example a high voltage potential, to the drain terminal of the memory cell 102. By also providing a third voltage potential to a control gate terminal of the memory cell 102, for example an intermediate voltage level, electrons accelerated between the source and drain terminal of the memory cell 102 can cross an insulation between the source/drain channel and the floating gate and may thus be injected into the floating gate. By accumulating charge on the floating gate of a memory cell 102 the threshold level of the memory cell 102 is changed.

During read operations, the threshold levels of memory cells 102 can be detected by means of the sense amplifiers 108. Each sense amplifier 108 usually compares a current or voltage received from a corresponding bitline 106 with a reference current or voltage $V_{Ref}$ provided to this sense amplifier 108. For example, a current through a memory cell 102 for a fixed control gate voltage may be compared with a fixed reference current by the sense amplifier 108. The reference current may be provided by a reference cell with a known threshold level. Depending on the comparison of the reference threshold level with the threshold level of a memory cell 102 selected by means of the multiplexers 107 and the column decoder 103, one of several logical states can be detected for the memory cell 102 and will be output by the sense amplifier 108, for example by converting the current through the memory cell into a corresponding voltage.

In the example shown in FIG. 1, the data to be written by the write circuits 109 and detected by the sense amplifiers 108 is transferred from and to a data latch 110. The data latch 110 is connected to a data bus 111 for transferring data within the memory device 100.

The non-volatile memory device 100 further comprises a control circuit 112 that controls the operation of the multiplexers 107, the sense amplifiers 108 and the write circuits 109. The control circuit is connected to a control bus 113, which is used, for example, to select one of the possible operations of the memory device 100, for example a reading operation, a writing operation, an erasing operation or a verification operation. The control circuit 112 is further connected to the data latch 110.

The memory device 100 further comprises two comparators 114, each comparator connected to one of the sense amplifiers 108 and the data latch 110. The comparators 114 may be used to compare a programming state detected by one of the sense amplifiers 108 with a programming target value stored in the data latch 110. The output of the comparators 114 is connected to the control circuit 112. Alternatively, the output of the comparators 114 may be fed back to the data latch 110 directly.

Figure 2:
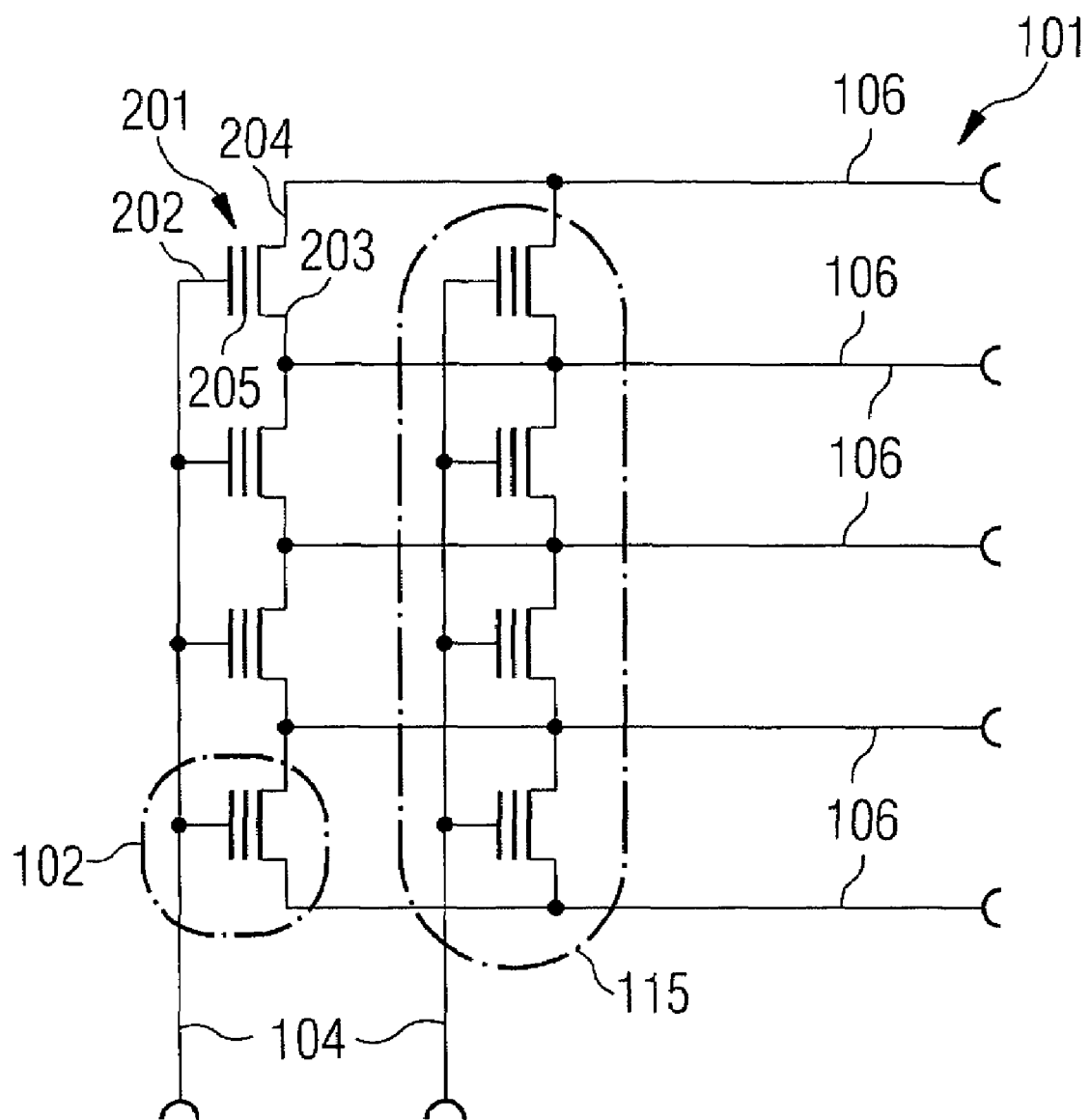
FIG. 2 shows a block diagram of a NOR-type array of memory cells of a non-volatile memory device.

FIG. 2 shows an exemplary configuration of an array 101 of memory cells 102. In the presented example, floating gate transistors 201 are use to form the memory cell 102. In the example presented, four rows of floating gate transistors 201 with two columns each are shown. All control gate terminals 202 of all floating gate transistors 201 of each column are connected to a common wordline 104. Each pair of a source terminal 203 and a drain terminal 204 is connected to two neighboring bitlines 106. Thus, the conductivity of a channel formed between the source terminal 203 and the drain terminal 204 of the floating gate transistor 201 can be detected by comparing a voltage potential of the corresponding two neighboring bitlines 106. The threshold of the floating gate transistor 201 is influenced by the amount of charge stored on a floating gate 205 of each of the transistors 201.

Alternatively to the floating gate transistors 201 comprising a floating gate 205 shown in FIG. 2, nitride ROM cells comprising a MOSFET transistor with a dielectric layer between a source-drain channel and a control gate 202 may be used as memory cells 102. Because, unlike floating gate transistors 201 with a conductive floating gate 205, charge trapped in the dielectric layer serving as a charge storage element is trapped near the source terminal 203 or the drain terminal 204, two bits of information may be stored in such a memory cell 102 as described in the U.S. Pat. No. 6,011,725 (the "'725 patent") by Eitan, which is incorporated herein by reference.

Apart from the configuration of the array 101 shown in FIG. 2, other configurations of arrays of memory cells 102 are known to a person skilled in the art and are equally applicable to the present application. For example, a so-called NAND array in which blocks of memory cells 102 are connected in series can be used. By connecting a block of memory cells 102 in series and connecting only a first source terminal 203 of a first memory cell 102 of the block 115 and a last drain terminal 204 of a last memory cell 102 of the block 115, the number of bitlines 106 required to control the array 101 can be reduced. Consequently, non-volatile memory devices 100 having an array 101 in NAND configuration can have a higher integration density as the array 101 presented in FIG. 2.

Figure 3:
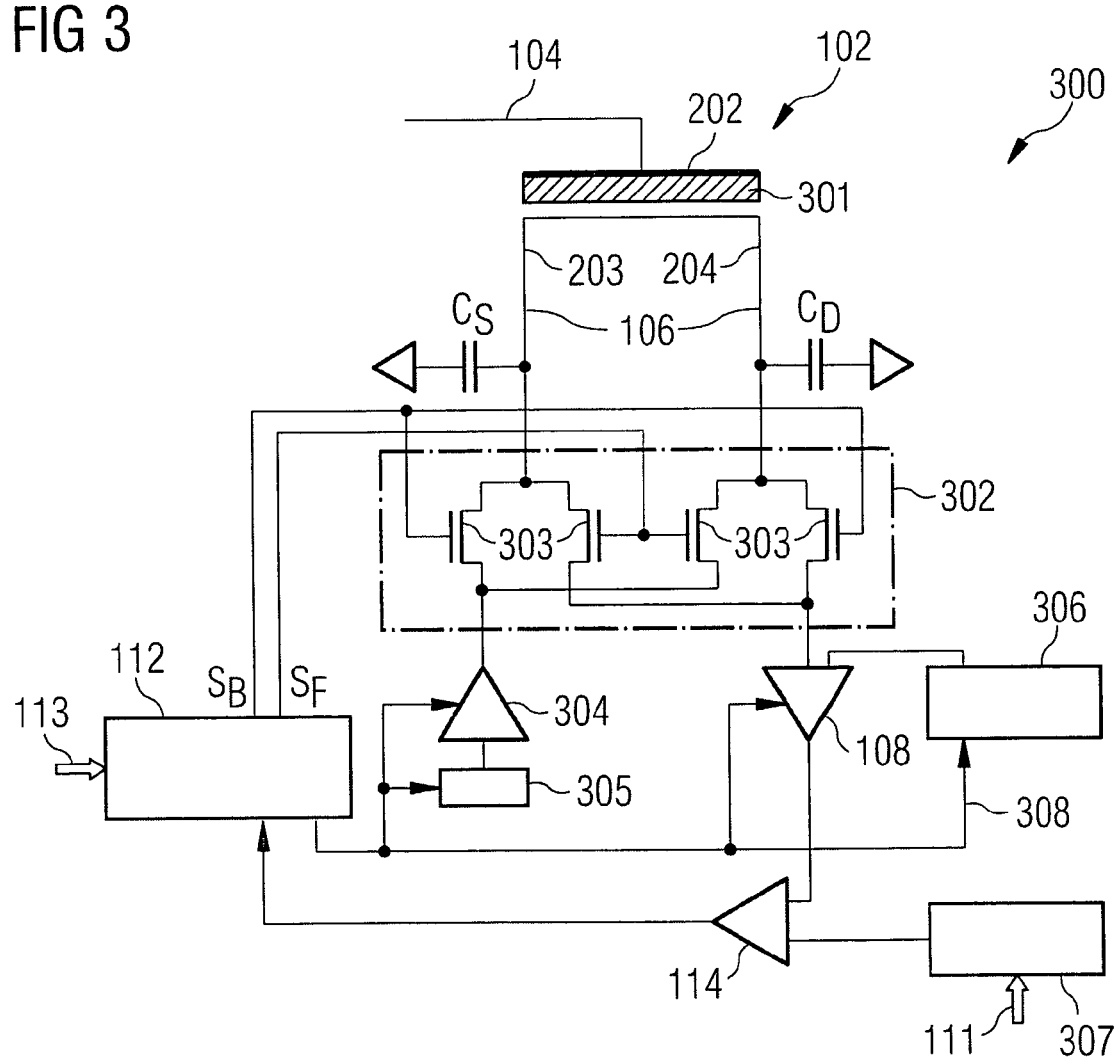
FIG. 3 shows a more detailed block diagram of a control circuit in accordance with an embodiment of the invention.

FIG. 3 shows a more detailed block diagram of a circuit arrangement 300 according to an embodiment of the present invention comprising a 2-bit NROM memory cell 102. For reasons of representational simplicity, only a single memory cell 102 is shown, which comprises a MOSFET transistor with a nitride layer 301 between its control gate 202 and a channel formed between its source terminal 203 and its drain terminal 204. The source terminal 203 and the drain terminal 204 are connected by two bitlines 106 with a direction selection circuit 302.

The bitlines 106 are comparatively long, such that each of them has an associated bitline capacity $C_S$ and $C_D$, respectively. The direction selection circuit 302 comprises four MOSFET transistors 303, which are controlled by the application of either a first control signal SF to two of the transistors 303 or by application of a second control signal $S_B$ to the other two transistors 303.

By providing the first control signal SF to the first two transistors 303, a bitline driver 304 is connected by the first bitline to the drain terminal 204 and the sense amplifier 108 is connected by means of the second bitline 106 to the source terminal 203. By providing the second control signal $S_B$ to the direction selection circuit 302, the bitline driver 304 is connected to the source terminal 203 and the sense amplifier 108 is connected to the drain terminal 204. Consequently, the memory cell 102 can be read in two different directions as described in the '725 patent. The direction selection circuit 302 may replace or be part of a multiplexer 107, which is not shown in FIG. 3 for reasons of representational simplicity.

The bitline driver 304 is driving one of the bitlines 106 during a read or verify operation with a first voltage potential generated by a high voltage source 305. The high voltage source 305 may be a pump source or a voltage multiplier, for example.

In order to detect a threshold level of the memory cell 102, the other bitline 106 is connected with the sense amplifier 108. The sense amplifier 108 is also connected to a reference source 306, for example a reference cell connected to a reference bitline and driven by a reference bitline driver.

Different methods for detecting a threshold level of a memory cell 102 and thus for sensing a programming state of the memory cell 102 are known to persons skilled in the art. In the embodiment shown in FIG. 3, a first bit can be stored in the nitride layer 301 near the source terminal 203 and the second bit can be stored near the drain terminal 204. Consequently, the sense amplifier 108 will provide one of two logical values for each direction chosen by the direction selection circuit 302 to the comparator 114 connected to its output.

The output of the sense amplifier 108 provided to the comparator 114 is compared with a designated target value stored in a target latch 307. The target latch 307 may be the data latch 110 or an independent latch used for the purpose of verification. The result of the comparison of the comparator 114 is transferred to the control circuit 112 for verification. In case the control circuit 112 verifies that the memory cell 102 was programmed correctly, i.e., that its threshold level detected by the sense amplifier 108 is compatible with an expected target value stored in the target latch 307, no further programming and verification of the memory cell 102 is necessary. Consequently, by means of a control line 308, a disable signal is transferred to the bitline driver 304, the sense amplifier 108 and the reference source 306. In case a separate high voltage source 305 is used by each bitline driver 304, the disable control signal may also be sent to the high voltage source 305 in order to deactivate the high voltage source 305.

In the exemplary embodiment shown in FIG. 3, the sense amplifier 108 is assumed to require an operation current of 40 μA, the bitline driver 304 is assumed to require an operating current of 32 μA and the reference source 306 is also assumed to require an operating current of 32 μA. Thus, in total, by deactivating the bitline driver 304, the sense amplifier 108 and the reference source 306, more than 100 μA of operating current can be saved by preventing an additional, unnecessary verification step.

FIGS. 4A to 4D show target values, programming pulses and verification results for a block 115 of four memory cells 102 according to different embodiments of the present invention.

For the scenarios presented in FIGS. 4A to 4C, it is assumed that each memory cell 102 is connectable to a separate sense amplifier to enable parallel verification of all memory cells 102. In the present scenarios, a target value comprising the bit pattern "0110" is to be programmed to memory cells 102 of the block 115.

A first scenario presented in FIG. 4A will be described in conjunction with a flow chart presented in FIG. 6. It is assumed here that all memory cells 102 of the block 115 of selected memory cells 102 are erased at the beginning of the programming cycle corresponding to a high logic value "1".

In a first step 601, all memory cells 102 of the block 115 to be programmed to a first logic value are selected to form a first group of memory cells 401. The first group of memory cells 401 is highlighted by a different background in FIG. 4A.

For example, a low logic value, for example a binary "0", may represent the first logic value. As the memory cells 102 of the block 115 of memory cells are erased initially, they already are in a state detected as a logical "1", i.e., the high logic value. Consequently, only memory cells 102 that are to be programmed to the first logic value different from the current logic value need to be programmed and verified.

In a step 602, one or a sequence of programming pulses are programmed into all memory cells 102 of the first group of memory cells 401.

Programming in the context of this application means to either increase or decrease the charge stored on a charge storage element of a memory cell 102. Thus, step 602 comprises sending at least one programming pulse adapted to change the threshold level of individual or all memory cells 102 of the block 115 to a different level.

Particularly in flash EEPROM devices, memory cells 102 can be programmed to a first logic value, often called "programmed" state, independently, whereas they are programmed to a second logic value, often called "erased" state, one erase block at a time. Such erase blocks often comprise a large number of memory cells 102 and may be different in size or organization from the blocks 115 used for programming and verification.

However, even in cases where the entire block 115 is programmed, e.g., to a second logic value, so-called pages of memory cells 102 within the block 115 need to be verified independently. Verification of memory cells 102 may take place immediately before and after erasing or programming and is called "pre-verify", "program verify", "program before erase verify" (PBEV) and "program after erase verify" (PAEV) respectively.

During "program verify" individual memory cells 102 of a block 115, which are in a known state, e.g., corresponding to the second logic value or the "erased" state, are programmed and verified to reach a first logic value, e.g., the "programmed" state. During PBEV, all memory cells 102 of a block 115 of memory cells 102 are programmed and verified to a first predefined threshold level, e.g., the "programmed" state. During PAEV, all memory cells 102 of a block 115 of memory cells are programmed and verified to a second predefined level, e.g., the "erased" state.

In step 603 the threshold level of the memory cells 102 of the first group of memory cells 401 is detected. In the example, as only the first and the last memory cell 102 of the block 115 of memory cells 102 are to be programmed, only a first and a fourth sense amplifier 108 is activated. In contrast, a second and a third amplifier 108 are deactivated by means of the control circuit 112. Consequently, in contrast to the prior art, only half of the sense amplifiers 108 are active during the first detection step 603.

In a next step 604 the detected threshold values of the first group of memory cells 401 are verified. For this purpose a comparator 114 compares the output of the sense amplifier 108 with a target value stored in the target latch 307. The control circuit 112 only needs to consider the outputs of the comparators 114 of the first and fourth comparators 114. The output of a second and a third sense comparator 114 can be ignored.

In some designs the steps 603 and 604 of detection and verification may be performed together, for example in designs in which an observed analog threshold level is directly compared with an analog reference threshold level. Alternatively, the detected threshold level can be converted to a digital value first and this digital value may be compared with a reference digital value stored in the target latch 307 as described above. In some designs, a comparison of earlier-detected threshold values may be performed, even if no subsequent detection took place in order to keep the comparison logic simple. This is due to the fact that the detection phase often requires more time and electrical energy than the subsequent verification phase.

In the scenario depicted in FIG. 4A, a threshold level of a first memory cell 102 is verified unsuccessfully whereas the threshold level of the fourth memory cell 102 is verified successfully. Consequently, the overall output of the verification step 604 is invalid, such that in step 605 the verification operation is resumed as step 602.

Depending on the sensitivity of the memory cells 102 to over-programming, either the first memory cell 102 only or the first and the fourth memory cells 102 are subjected to further programming with one or several programming pulses in step 602. After completion of the programming, a further threshold detection step 603 and verification step 604 are performed as described above. As shown in FIG. 4A, this time the verification step 604 results in a valid verification result for the first and the fourth memory cells 102. Consequently, all memory cells 102 of the first group of memory cells 401 have been programmed correctly and the method ends.

Because during the step of detecting the threshold levels 603 only half of the sense amplifiers 108 and supporting components 304 and 306 where enabled, only half of the current was used during verification compared with the prior art in which all sense amplifiers 108 are active during each detection phase. Since, on average, only half of the memory cells 102 of a block 115 are actually programmed to a first logic value in a two-level memory cell 102, on average half of the current required for verification can be saved according to the first embodiment.

Figure 7:
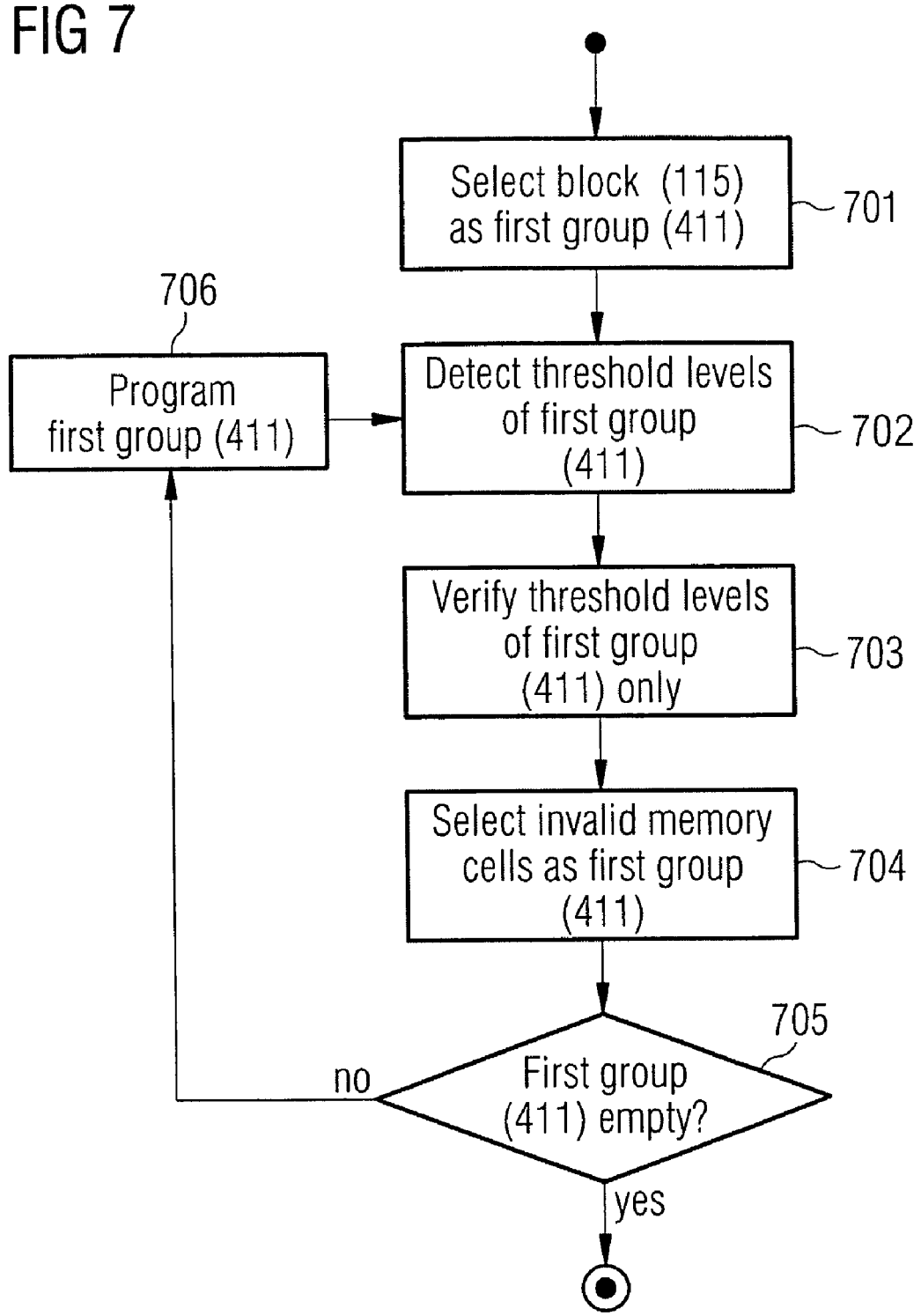
FIG. 7 shows a flowchart of a method for verifying a block of memory in accordance with the second embodiment.

FIG. 4B shows a second scenario in accordance with a second embodiment of the invention. A flow chart of a second method for programming and verifying the block 115 of non-volatile memory cells 102 is shown in FIG. 7.

In this scenario, initially all memory cells 102 of the block 115 are assigned to a first group of memory cells 411. For example the programming state of all memory cells 102 of a block of memory cells 411 may be unknown at the beginning of the second method.

In step 702, the thresholds of all memory cells 102 of the first group of memory cells 411 are detected. Thus, in the first verification step 702, the threshold of all memory cells 102 of the block 115 is detected.

In step 703, the detected thresholds are compared with predefined threshold levels provided for each one of the memory cells 102. In the scenario shown in FIG. 4B, the first memory cell 102 is verified unsuccessfully whereas the remaining memory cells 102 are verified successfully.

In step 704 only those memory cells 102, which were verified unsuccessfully in step 703 are selected for the revised first group 411. Thus, the first group 411 now comprises only the first memory cell 102 in the given example as shown by the grey background in FIG. 4B.

In a subsequent step 705 a check is performed, whether the first group of memory cells 411 is empty. In the presented example, the first group of memory cells 411 is not empty and, consequently, the method shown in FIG. 7 resumes at step 706.

In step 706 all memory cells 102 comprised in the first group of memory cells 411, in this case comprising the first memory cell 102 only, are programmed using a single or a sequence of programming pulses.

After programming the memory cells 102 of the first group of memory cells 411 the steps 702, 703 and 704 of detecting, verifying and selecting the memory cells 102 of the first group of memory cells 411 are repeated as described above.

In the example presented in FIG. 4B, the verification step performed on the second run of step 703 is successful, as the first memory cell 102 has been programmed to the designated target level. Consequently, in step 704 no memory cell is selected to form the first group of memory cells 411. As a result, in the subsequent step 705, the check for emptiness is successful and the method presented in FIG. 7 ends.

At the first run of the step 702 threshold levels of all memory cells 102 of the block 115 of memory cells were detected. However, in the second run of the detection step 702 only one out of four sense amplifiers 108 and supporting components 304 and 306 were enabled. Thus, only five out of eight possible verifications were carried out.

FIG. 4C shows a scenario in accordance with a third embodiment of the present invention. A method according to the third embodiment comprises elements of the first and second embodiments and is depicted as a flowchart in FIG. 8.

In a first step 801, all memory cells 102 that are to be programmed to a first logic level are selected as a first group of memory cells 421.

In step 802, a sequence of programming pulses is sent to all memory cells 102 of the first group of memory cells 421. In the example presented in FIG. 4C, the first group of memory cells 421 comprises the first and the fourth memory cells 102.

In a subsequent step 803, only threshold levels of memory cells 102 of the first group 421 are detected.

In a next step 804, the detected threshold values are compared with predefined threshold levels provided for each one of the first group of memory cells 421. As can be derived from FIG. 4C, the threshold level of the first memory cell 102 has not reached a satisfactory level whereas the threshold level of the fourth memory cell 102 has already reached a satisfactory level.

In a next step 805, all those memory cells 102 of the first group of memory cells 421 that have already reached satisfactory threshold levels are removed from the first group 421. Consequently, in step 805 the fourth memory cell 102 is removed from the first group 421.

A check is performed in step 806, testing whether the first group of memory cells 421 is empty or not. As shown in FIG. 4C, in the presented example the first memory cell 102 remains in the first group 421 such that the methods for programming continues at step 802.

As described earlier, during steps 802, 803 and 804 the remaining memory cell 102 of the first group of memory cells 421 is programmed, has its threshold value detected and is verified. As can be seen in FIG. 4C, at the end of the second verification step 804, the only remaining memory cell 102 to be verified is verified successfully. Thus, in step 805, the first memory cell 102 is removed from the first group of programming cells 421.

Figure 8:
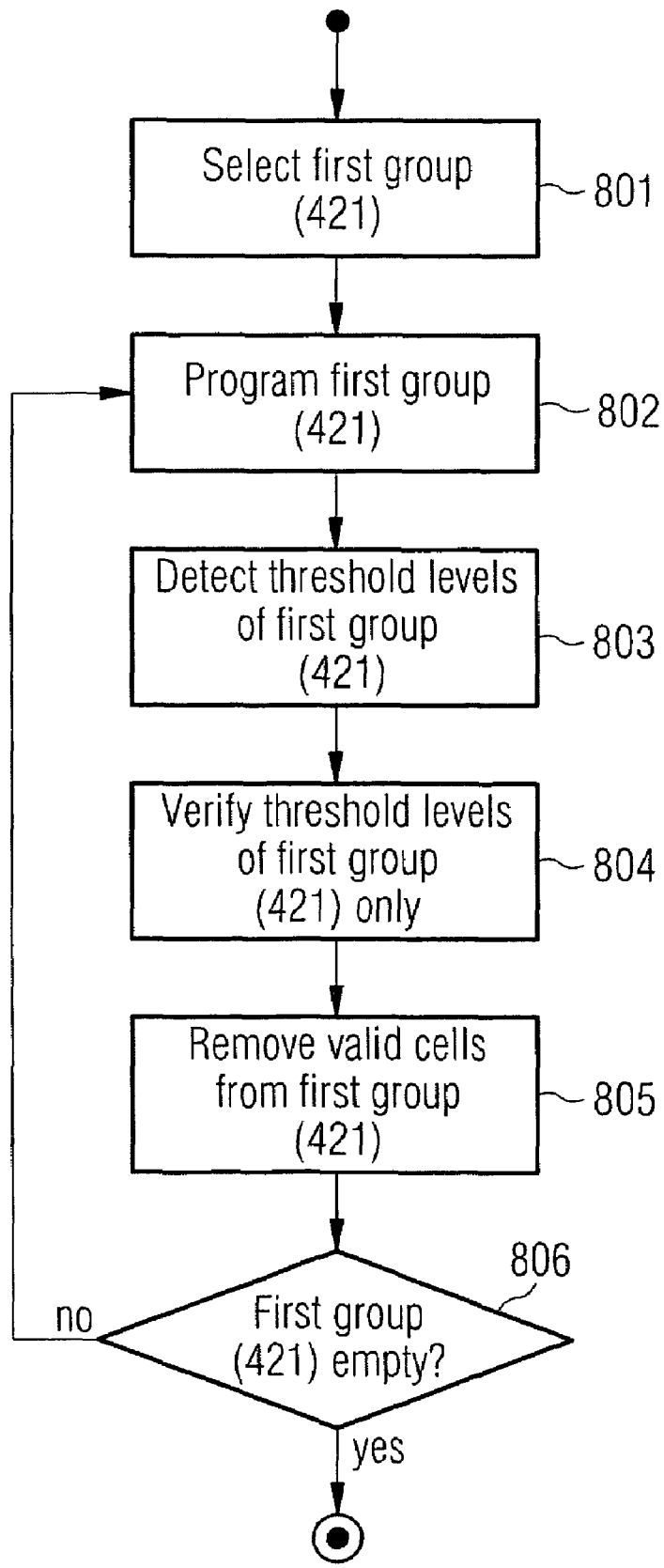
FIG. 8 shows a flowchart of a method for verifying a block of memory in accordance with the third embodiment.

In a last step 806, it is detected that the first group of memory cells 421 is empty, i.e., that all memory cells 102 of the block 115 were verified successfully, and continuation of the method disclosed in FIG. 8 ends.

As can be seen from FIG. 4C, only three threshold levels are detected in the third scenario in accordance with the method shown in FIG. 8. As a result 62.5% of the energy used for precharging of bitlines 106 and detection of threshold levels can be saved with respect to memory devices performing complete verification of all memory cells 102 of a block 115.

FIG. 4D shows a fourth scenario for programming and verification of the block 115 of memory cells 102 in accordance with a fourth method presented as a flowchart in FIG. 9. In this example, only a single sense amplifier 108 is available for detection of threshold levels, thus verification is performed sequentially for a first group of memory cells 431.

In a first step 901, all memory cells 102 that are to be programmed to a first logic value are marked as a first group of memory cells 431. In the given example, the first and the fourth memory cell 102 of the block 115 are marked.

In a subsequent step 902, a check is performed, whether any memory cell 102 is marked. If, as in the case of the example presented in FIG. 4D, at least one memory cell 102 is marked, all marked memory cells 431 are programmed with one or several programming pulses in step 903.

In step 904 a first memory cell 102 of the block of memory cells 115 is selected. If the selected memory cell 102 is marked, as checked in step 905, the method presented in FIG. 9 continues in step 906 with verification of the selected memory cell. The verification comprises the detection of a threshold level of the selected memory cell 102 and the comparison with a predefined target value for the selected memory cell 102.

In step 907, it is determined, whether the verification performed in step 906 was successful. In case of the example presented in FIG. 4D, this is not the case and the method continues at step 909. If, however, the verification performed in step 906 is successful the method continues with step 908, in which the selected memory cell 102 is unmarked and thus removed from the first group of memory cells 431. After unmarking the selected memory cell 102 in step 908, the method continues in step 909.

In step 909, it is checked, whether the selected memory cell 102 is the last memory cell 102 of the block 115. If, as in the presented example, this is not the case, the method continues in step 910 by selecting the next memory cell 102. After selecting the next memory cell 102, the method continues at step 904 as described above. If, in step 909, the last memory cell 102 of the block 115 of memory cells 102 is detected, the method continues at step 902 as described above.

As can be seen from FIG. 4D, in the first verification phase following the first programming phase, the first and the fourth memory cells 102 are verified. In the second verification phase, however, only the fourth memory cell 102 is verified.

FIG. 5A shows a fifth scenario for programming and verification using a fifth embodiment of the invention according to a method presented in FIG. 10. According to the fifth scenario, a block 115 comprising eight memory cells 102 is to be programmed and verified. Two sense amplifiers 108 are available for verification that operate autonomously from each other.

In a first step 951, a first group of memory cells 511 is selected. In accordance with the first embodiment of the invention, the first group 511 may comprise only memory cells 102 that are to be programmed to a first logic value.

In a second step 952, the memory cells 102 comprised in the first group 511 are programmed by sending a group of programming pulses to the memory cells 102 of the first group 511.

In a next step 953, a first subgroup 512 and a second subgroup 513 of the first group 511 of memory cells 102 are selected. In the example presented in FIG. 5A, the first two memory cells 102 of the first group 511 comprised in the first four memory cells 102 of block 115 are selected as first subgroup 512. The remaining two memory cells 102 of the first group 511 comprised in the last four memory cells 102 of block 115 are selected as the second subgroup 513.

Following the selections of the first and second subgroups 512 and 513, each one of the sense amplifiers 108 and associated circuit components performed a verification of the first subgroup 512 and the second subgroup 513 in steps 954 and 955, respectively. Memory cells 102 verified correctly may be removed from the first group of memory cells 511.

Because the two sense amplifiers 108 are operated independently from each other, as is an associated control circuit 112, the verification of the first subgroup 512 and the second subgroup 513 can be performed at the maximum possible speed. For example, one sense amplifier 108 can proceed to verify a second memory cell 102 of the first subgroup 512 by selecting the next bitline 106 that is to be precharged, while the other sense amplifier 108 remains connected to a first bitline 106 of the second subgroup 513.

When verification of both subgroups 512 and 513 is complete, in a step 956, it is checked whether all memory cells 102 of the first group of memory cells 511 have been successfully verified. As this is not the case in the scenario presented in FIG. 5A, the method continues at step 952 by programming either all memory cells or the memory cells 102 remaining in the first group 511 again.

On the second execution of step 953, the first and second subgroups 512 and 513 can be reassigned. Because, as presented in FIG. 5A, all memory cells 102 of the previous first subgroup 512 have been verified successfully, the new first subgroup 512 is extended to comprise the first memory cell 102 of the previous second subgroup 513. Inversely the previous second subgroup 513 is reduced in size, such that it only comprises the second memory cell 102 of the previous second subgroup 513.

Consequently, in steps 954 and 955, each sense amplifier 108 only has to verify a single memory cell 102 on the second occasion. Because in this run both memory cells 102 are verified successfully, the method ends after determining this fact in step 956.

In order to allow autonomous operation of sense amplifiers 108, control circuits 112 and possibly associated circuit components like bitline drivers 304, reference sources 306, multiplexers 107 and direction selection circuits 302 may be provided for each sense amplifier 108. Alternatively, a single control circuit 112 may comprise a state machine for each sense amplifier 108 controlled. The state machine may be used to store the state of each of the memory cells 102 of a block 115 of memory cells 102.

Whether or not all sense amplifiers 108 can be connected to all bitlines 106 of an array 101 of memory cells will depend on the actual design of the memory device 100. In practice, a memory device 100 may comprise a design in which two sense amplifiers 108 with associated control circuits are adopted to verify bitlines 106 of a single block 115 of memory cells 102.

FIG. 11 shows a possible gain in power consumption for a memory device 100 comprising 256 sense amplifiers 108. During a verification operation comprising the verification of four subsequent programming pulses, more and more sense amplifiers 108 are deactivated in order to save power. In the last cycle, only two of the 256 sense amplifiers 108 remain active.

Methods for verifying a block 115 of memory cells 102 as described above may also be used by memory devices comprising multi level cells, which can be programmed to a variety of threshold levels corresponding to multiple logic states. For example, a memory cell that can be programmed to one of four threshold levels can be used to store two bits of data, each combination of bits associated with a predefined threshold value or range.

Because threshold ranges are typically much smaller in multi level cells as in conventional single bit memory cells 102, programming of multi level cells is performed in an incremental fashion, wherein only relatively small increments are programmed in each programming cycle. Thus, the number of programming and verification cycles is larger than for a single bit memory cell 102, resulting in many verification operations with a correspondingly high consumption of power. For example, 20 program and verify cycles may be performed for a block 115 of multi level cells.

FIG. 5B shows a sixth scenario of a sixth embodiment of the invention for programming and verification of threshold levels of multi level memory cells. In the sixth scenario, each memory cell 108 can be programmed to one of four distinct target threshold ranges, each one associated with a predefined bit-pattern. Thus, the four memory cells 102, which are programmed in the sixth scenario can store eight bits of information.

As before, only those memory cells 102 that received programming pulses during a previous programming cycle are verified in a subsequent verification cycle. Initially, memory cells 102 are in an erased state, which is the lowest programming state, for example corresponding to a threshold level of 0,0 V. Thus, a first memory cell 102 to be programmed to a first threshold range, for example a threshold voltage of 0,0+/−0,1 V is never programmed or verified in the scenario presented in FIG. 5B. A fourth memory cell 102 is verified twice only, until it reaches a threshold value within its predefined target threshold range of 0,5+/−0,1 V. Only the third memory cell 102, which is to be programmed to the highest possible target threshold range of 1,5+/−0,1 V is verified in each cycle, i.e., five times in the presented example.

In total, eleven verification steps are performed, out of a total of 20 possible verification steps, in case each memory cell 102 would have been verified at each verification cycle.

What is claimed is:

1. A method for programming a block of memory cells of a non-volatile memory device, the method comprising;
    detecting a first threshold level for each one of the memory cells of the block of memory cells;
    verifying the block of memory cells by comparing each one of the first detected threshold levels with predefined target levels provided for each one of the memory cells of the block of memory cells;
    selecting all memory cells that are verified unsuccessfully as a first group of memory cells;
    programming at least one programming pulse into all memory cells of the first group;
    detecting a threshold level for each one of the memory cells of the first group only; and
    verifying the first group of memory cells by comparing each one of the detected threshold levels with predefined target levels provided for each one of the first group of memory cells.

2. The method according to claim 1, wherein the steps of programming, detecting and verifying are performed repeatedly, until all memory cells of the first group of memory cells have been verified successfully.

3. The method according to claim 2, wherein, in the step of verifying the first group of memory cells, memory cells that have been verified successfully are removed from the first group, such that, when the first group is empty, all memory cells of the first group of memory cells have been verified successfully.

4. The method according to claim 1, wherein at least some of the memory cells of the first group of memory cells are verified sequentially.

5. The method according to claim 1, wherein at least some of the memory cells of the first group of memory cells are verified in parallel.

6. A method for programming a block of memory cells of a non-volatile memory device, the method comprising:
    selecting memory cells of the block of memory cells that are to be programmed to a programmed state as a first group; and
    while the first group contains at least one memory cell, performing the steps of:
        programming at least one programming pulse into all memory cells of the first group;

detecting a threshold level for each one of the memory cells of the first group only;
comparing each one of the detected threshold levels with a predefined target level associated with the programmed state; and
reassigning the first group such that it only contains memory cells whose threshold level is below the predefined target level associated with the programmed state.

7. The method according to claim 6, wherein the block of memory cells is prepared for programming using the following steps:
programming all memory cells of the block of memory cells to the programmed state; and
programming all memory cells of the block of memory cells to an erased state.

8. A method for programming a block of memory cells of a non-volatile memory device, the method comprising:
selecting a first group of memory cells of the block of memory cells; and
while the first group contains at least one memory cell, performing the steps of:
programming at least one programming pulse into all memory cells of the first group;
detecting a threshold level for each one of the memory cells of the first group only; and
removing the memory cells from the first group, if a detected level of the memory cell lies within a predefined target range.

9. A memory card device, comprising:
an array of non-volatile memory cells;
a column decoder coupled to the array;
at least one write circuit coupled to the array;
at least one sense amplifier coupled to the array; and
a micro-controller, wherein the micro-controller is adapted to perform a computer program for causing the execution of the steps of:
detecting a first threshold level for each one of the memory cells of the block of memory cells;
verifying the block of memory cells by comparing each one of the first detected threshold levels with predefined target levels provided for each one of the memory cells of the block of memory cells;
selecting all memory cells that are verified unsuccessfully as a first group of memory cells;
programming at least one programming pulse into all memory cells of the first group;
detecting a threshold level for each one of the memory cells of the first group only; and
verifying the first group of memory cells by comparing each one of the detected threshold levels with predefined target levels provided for each one of the first group of memory cells.

10. The memory card device according to claim 9 wherein the steps of programming, detecting and verifying are performed repeatedly, until all memory cells of the first group of memory cells have been verified successfully.

11. A non-volatile memory device comprising:
an array of non-volatile memory cells;
a column decoder coupled to the array;
at least one write circuit coupled to the array;
at least one sense amplifier coupled to the array; and
a micro-controller, wherein the micro-controller is adapted to perform a computer program for causing the execution of the steps of:
selecting memory cells of the block of memory cells that are to be programmed to a programmed state as a first group; and
while the first group contains at least one memory cell, performing the steps of:
programming at least one programming pulse into all memory cells of the first group;
detecting a threshold level for each one of the memory cells of the first group only;
comparing each one of the detected threshold levels with a predefined target level associated with the programmed state; and
reassigning the first group such that it only contains memory cells whose threshold level is below the predefined target level associated with the programmed state.

* * * * *